(12) United States Patent
Stone et al.

(10) Patent No.: US 6,259,717 B1
(45) Date of Patent: *Jul. 10, 2001

(54) ASYMMETRIC RESONANT OPTICAL CAVITY APPARATUS

(75) Inventors: Alfred Douglas Stone, North Haven; Richard Kounai Chang, Hamden, both of CT (US); Jens Uwe Noeckel, Dresden (DE)

(73) Assignee: Yale University, New Haven, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/056,525

(22) Filed: Apr. 7, 1998

Related U.S. Application Data

(63) Continuation of application No. 08/725,127, filed on Oct. 2, 1996, now Pat. No. 5,742,633.

(51) Int. Cl.[7] .................................................. H01S 3/08
(52) U.S. Cl. ............................. 372/92; 372/108; 385/146
(58) Field of Search ....................... 372/92, 108; 385/146

(56) References Cited

U.S. PATENT DOCUMENTS 5,742,633 * 4/1998 Stone ...................................... 372/92

* cited by examiner

Primary Examiner—Teresa M. Arroyo
Assistant Examiner—Gioacchino Inzirillo
(74) Attorney, Agent, or Firm—Ohlandt, Greeley, Ruggiero & Perle, LLP

(57) ABSTRACT

An asymmetric resonant optical cavity is constructed of an optically transmissive dielectric material having an index of refraction n. The cavity is configured as an oval cross-section of area A, having major and minor axes. An optical input couples an optical signal of wavelength $\lambda$ into the cavity. An output coupler is positioned in a near-field region of a surface point of the cavity thereby enabling coupling thereinto of optical energy of wavelength $\lambda$. The surface point on the cavity is determined by a minimum value of an expression which relates the Sin of the angle of incidence, at an angle $\phi$, to the curvature of the outer surface of the cavity. Further, the index of refraction n of the cavity's dielectric is chosen so as to avoid emission of physically separated beams at the point of exit of a beam

5 Claims, 6 Drawing Sheets

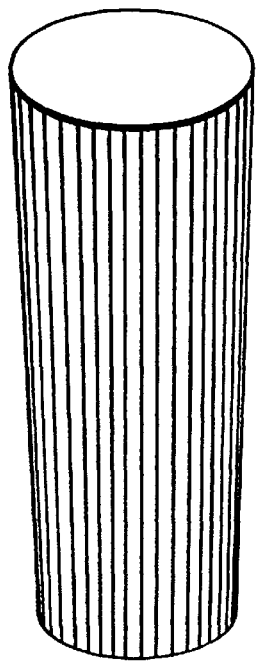
FIG. 1.
(PRIOR ART)
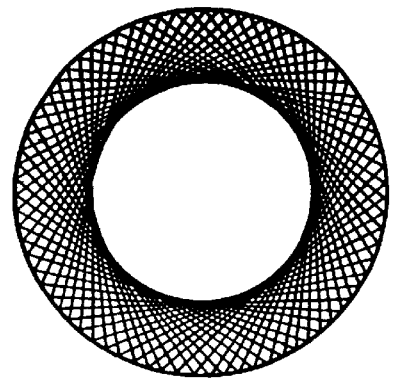
FIG. 2A.
(PRIOR ART)
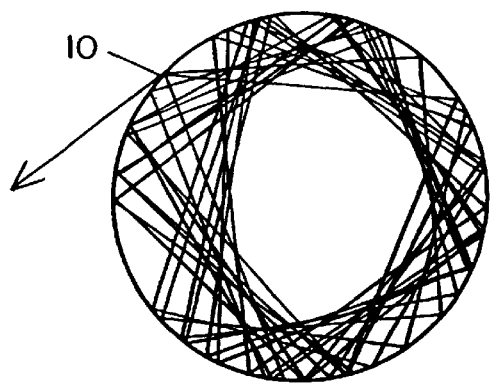
FIG. 2B.
(PRIOR ART)
FIG. 2C.
(PRIOR ART)
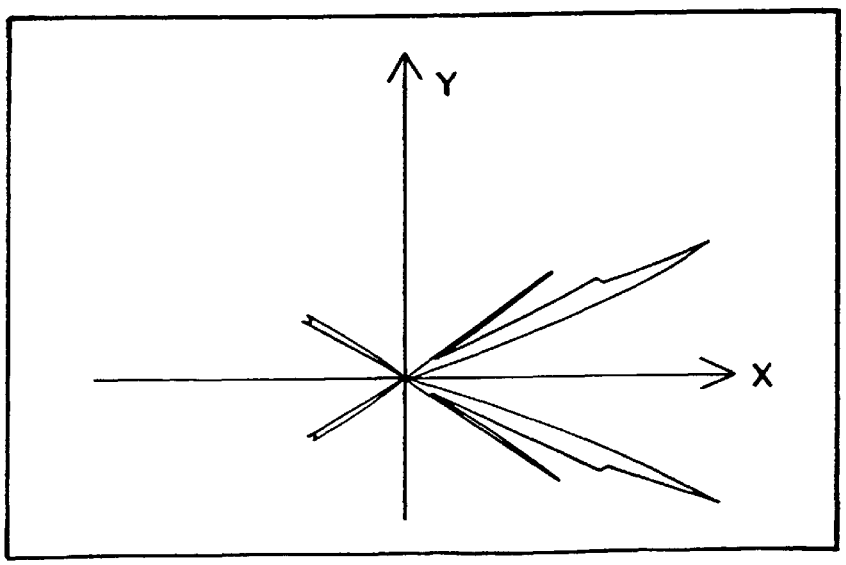

FIG. 9A.
FIG. 9B.
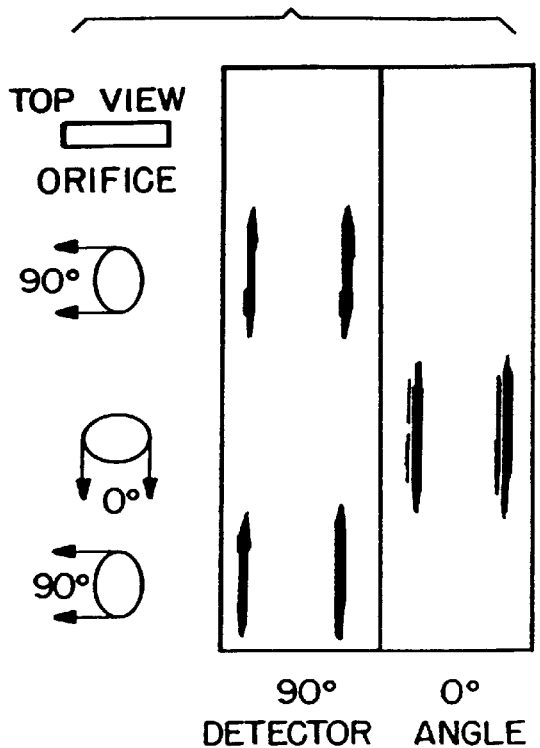
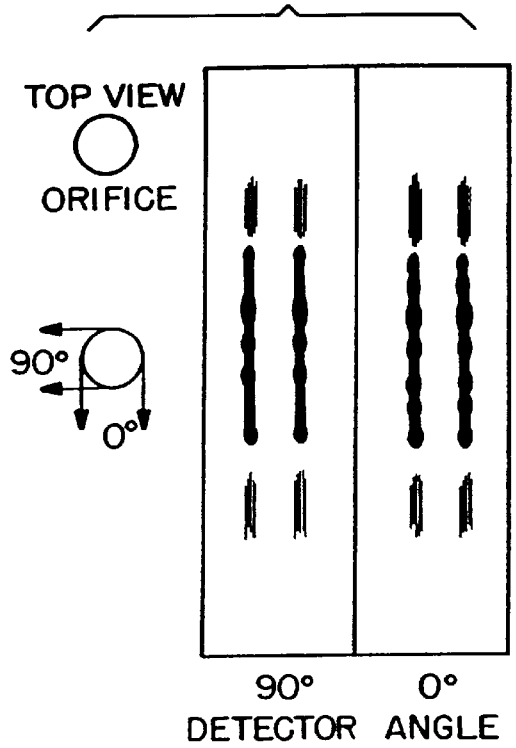
FIG. 10.
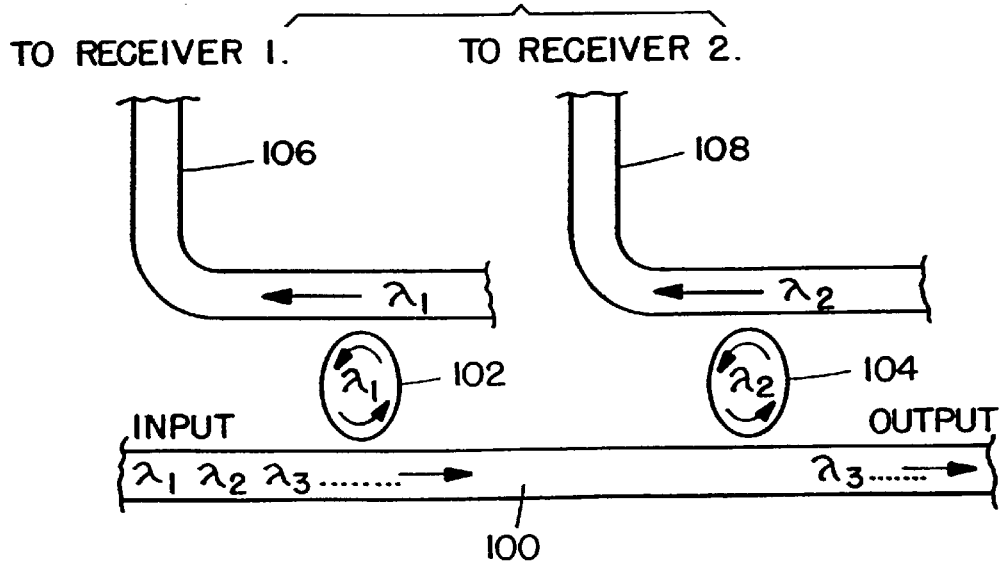

CROSS SECTIONAL VIEW

ASYMMETRIC RESONANT OPTICAL CAVITY APPARATUS

This Application is a continuation of U.S. patent application Ser. No. 08/725,127, filed Oct. 2, 1996, now U.S. Pat. No. 5,742,633.

The U.S. Government has license rights to this invention as a result of partial support of its development under U. S. Army Research Office Grant DAAH 04-94-G 0031 and NSF grant DMR 9215065.

FIELD OF THE INVENTION

This invention relates to resonant optical cavities and, more particularly, to asymmetric optical cavities which provide directional light emission at a wavelength dependent upon the structure of the optical cavity.

BACKGROUND OF THE INVENTION

A new class of optical resonators is comprised of convex dielectric bodies which are substantially deformed from cylindrical or spherical symmetry. See: J. U. Nöckel, A. D. Stone and R. K. Chang, Optics Letters 19, 1693 (1994); A. Mekis, J. U. Nöckel, G. Chen, A. D. Stone and R. K. Chang, Phys. Rev. Lett. 75, 2682 (1995); J. U. Nöckel and A. D. Stone, in *Optical Processes in Microcavities*, editted by R. K. Chang and A. J. Campillo (World Scientific Publishers, 1996). Such asymmetric resonant cavities (henceforth ARCs) exhibit high-Q (quality factor) whispering gallery (WG) modes (Q>1000) at distortions as large as 50% of the undeformed radius, R, of the corresponding circular (symmetric) resonant cavity. The emission pattern from these modes is highly directional, in contrast to the isotropic emission from symmetric cavities.

WG modes of symmetric cavities (dielectric spheres and cylinders) have high Q (long lifetime) because the light trapped in such a mode (when described by ray optics) always impinges on the boundary at the same (conserved) angle of incidence, $\chi$, where sin $\chi$>=1/n (n is the index of refraction of the dielectric); hence the light is almost totally internally reflected. Due to the curvature of the surface, there is an exponentially small correction to the law of total internal reflection which allows light to escape after very long times (this is called "evanescent leakage"). In ARCs on the other hand, the dominant mechanism for emission of light is not evanescent leakage but direct refractive escape via Snell's law because the angle of incidence sin $\chi$ is not conserved. In the ray-optics language these ARC resonances correspond to ray trajectories which initially are in WG orbits with sin $\chi$>1/n, but after a large number of reflections with the boundary eventually impinge on it with sin $\chi$<1/n and are then directly emitted according to Snell's law of refraction. The high-intensity regions in the near-field correspond to the regions on the boundary of the ARC where most of the refractive escape occurs; the far-field directionality can be determined by following the refracted rays.

In FIG. 1, a prior art cylindrical resonator of radius R is shown. The motion of a light ray in a WG mode circulating around its cross-section is shown in FIG. 2a. The motion forms a regular pattern with the angle of incidence the same at each reflection. As noted above, since this angle is initially above the angle required for refractive escape and remains so indefinitely, escape of optical energy occurs isotropically (equally in all directions) by the exponentially slow process of evanescent leakage (this escape is not shown in the figure).

Nöckel, Stone and Chang, in the paper entitled "Q spoiling and directionality in deformed ring cavities", introduced the idea that a deformation of the cross-section might induce directional emission due to refractive escape. The deformation they considered, shown in FIG. 2b, causes irregular (chaotic) ray motion and leads to refractive escape at a point 10 (FIG. 2b) with the far-field high emission directions shown in FIG. 2c. Note that the high emission directions are not parallel and hence intersect in the near-field leading to interference effects not describable by ray-optics. Moreover there are secondary (split) peaks at angles near those of the largest peaks. The near-field behavior of ARCs was not known at that time due to the limitations of the ray model used.

The occurrence of multiple and non-parallel emitted beams make the prior art deformed resonator unsuitable for optical devices employing ARCs. Moreover the lack of information about the near-field radiation pattern of ARCs made it impossible to design input and output couplers for this resonator.

SUMMARY OF THE INVENTION

We have now determined that the high emission intensity points typically correspond to the regions of highest curvature on the ARC surface and that an ARC based on the deformation of FIG. 2b would produce non-parallel beams because the regions of highest curvature on the boundary are not 180° opposite one another. This defect is avoided in ARCs with two-fold reflection symmetry, as discussed below. It is also shown how to avoid the occurrence of multiple intersecting beams.

Accordingly, it is an object of this invention to provide an ARC wherein the light is emitted at a predetermined location and in a predetermined direction.

It is another object of this invention to provide an improved ARC wherein the emitted light comprises a single beam or parallel (non-intersecting) beams.

It is still another object of this invention to provide an ARC with predetermined Q-value and directional emission pattern so as to maximize the input-output coupling to a range of optical devices.

An asymmetric resonant optical cavity is constructed of an optically transmissive dielectric material having an index of refraction n. The cavity may be in the form of a cylinder with a cross-section deformed from circularity or a spheroid with an oblate or prolate deformation. These deformations should be larger than 1% of the undeformed radius R but it is crucial that they maintain convexity, i.e. at no point should the curvature of the relevant cross-section change its sign. In the cylindrical case the resulting cross-section should be oval in shape and we will use this descriptive term henceforth. The oval cross-section will have a major (long) axis and a minor (short) axis and the ARC should have mirror symmetry with respect to both axes. The shape and index of refraction of the ARC is chosen so as to avoid multiple beams. For signal processing in optical communications, an ARC will be coupled in the near-field region to an input optical signal at a wavelength $\lambda$ which is in resonance with one of the whispering gallery resonances of the ARC. Typically this signal will be transmitted (possibly in modified form) through the ARC to an output coupler also positioned in the near field. The couplers must be oriented parallel to the tangent line at the point(s) of high emission intensity, which are determined (see below) to be approximately the points of highest curvature of the boundary. ARCs may also be used in signal generation, for example as resonators in microlasers or LEDs. In signal generation ARCs will produce highly directional beams of light along directions tangent to the points of highest curvature.

BRIEF DESCRIPTION OF THE DRAWINGS

FIG. 1 is a schematic view of a symmetric optical cavity resonator of cylindrical shape, having a radius R.

FIG. 2a is a ray tracing diagram of resonant ray paths within the optical resonator of FIG. 1.

FIG. 2b is a ray tracing diagram of resonant ray paths when a deformation is introduced of the type discussed in Nöckel et al., Optics Letters 19, 1693 (1994). Points where refractive escape occurs are indicated.

FIG. 2c is a polar plot of the far-field emission intensity for the deformation shown in FIG. 2b showing the multiple and intersecting beams which are avoided in the invention.

FIGS. 9(a)–9(b) illustrates the experimental results confirming the directional emission from a cylindrical ARC as described in the text.

FIG. 10 is a schematic of a channel-dropping filter which makes use of ARCs incorporating the invention hereof.

DETAILED DESCRIPTION OF THE INVENTION

Figure 3A:
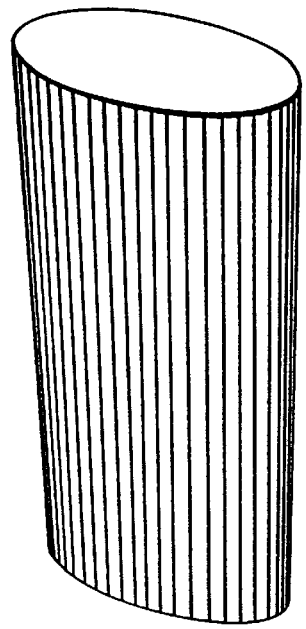
FIG. 3a is a schematic of a deformed cylindrical ARC with appropriate shape to avoid multiple intersecting beams.
Figure 3B:
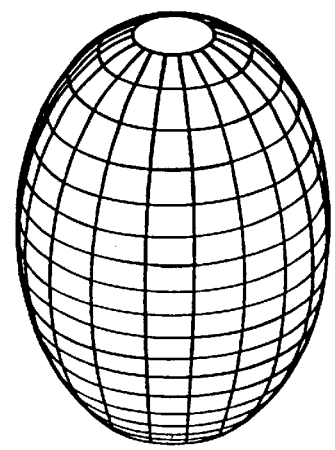
FIG. 3b is a schematic of a prolate spheroidal ARC.
Figure 4:
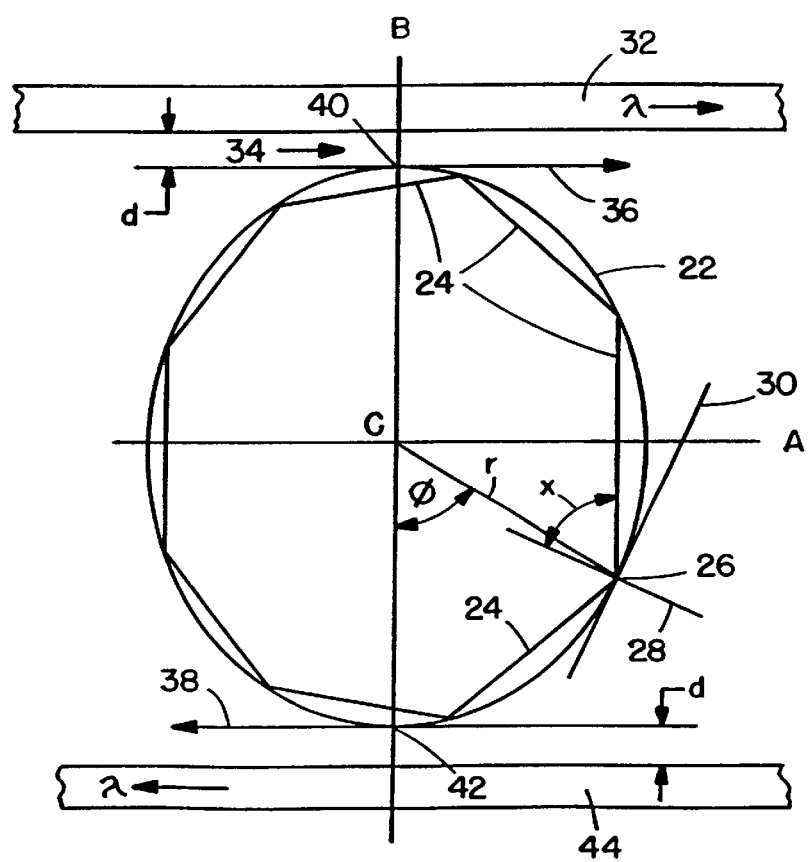
FIG. 4 is a schematic diagram of the cross-section of an asymmetric resonant cavity which defines certain of the dimensions and quantities used in the analysis of ray paths within the cavity.

FIG. 3 gives perspective drawings of cylindrical and spheroidal ARCs; FIG. 4 illustrates a cross-section 20 of the cylindrical ARC with the required reflection symmetry about the minor axis A and the major axis B. To describe the properties of the ARC 20 we must discuss the motion of a light ray within the ARC; we will use certain parameters to do so. A point on the outer surface 22 of the ARC is specified by a radius, r, and an angle $\phi$ which can be measured from either of the axes A,B. A light ray 24 circulates in a WG mode within ARC 20 with an angle of incidence $\chi$ defined at each reflection from the boundary as the angle between ray 24 and the normal direction 28 which is drawn perpendicular to a tangent 30 at point of incidence 26.

It is to be understood that the index of refraction n and the shape of the cross-section 20 determine the wavelengths of light which are resonantly enhanced along the ray path. The Q of the resonance determines how sharp is the resonance, i.e. how close to the prescribed wavelength the input signal must be to be resonantly enhanced or transmitted. Since the Q of the resonance is inversely proportional to its lifetime, there is a trade-off between greater frequency selectivity (higher Q) and faster switching capability (lower Q). By increasing the deformation of the ARC, the intrinsic Q of the resonances can be decreased from a very high value to any prescribed value which optimizes this trade-off. For lightwave communications at a switching rate of 5 Gigabits per second at the 1.53 micrometers communications wavelength, assuming a reasonable wavelength selectivity (bandwidth) of 0.05 nanometers requires a Q of order $10^4$. The simplest useful cylindrical ARC has a cross-section given by the formula:

$$r(\phi) = \frac{R}{\sqrt{1+\epsilon^2/2}}(1+\epsilon\cos 2\phi). \tag{1}$$

Figure 5:
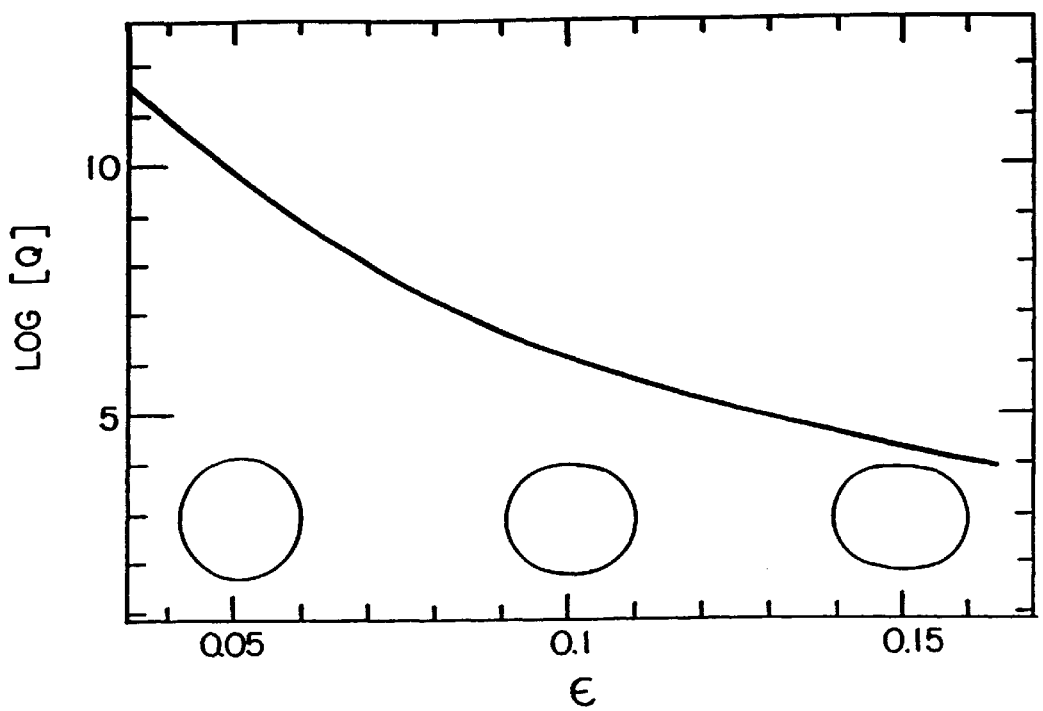
FIG. 5 is a plot of the logarithm of the Q value of a typical ARC whispering gallery resonance as a function of deformation $\epsilon$ for an ARC with a quadrupolar deformation. Three schematic pictures of the cross-section are shown for different values of $\epsilon$.

Here the parameter e measures the degree of deformation, the aspect ratio (ratio of minor to major axes) being $(1-\epsilon)/(1+\epsilon) \approx 1-2\epsilon$. $\epsilon=0$ corresponds to the case of a circular (symmetric) resonator. The shapes of the cross-section for three values of epsilon are shown in FIG. 5, where we also plot Q versus deformation for this ARC (obtained by numerical solution of the wave equation). Note that at roughly 10% deformation the Q value is in the range $10^4$ which we estimated above was optimal for lightwave communications; whereas for symmetric resonators the intrinsic Q is much too large.

Figure 6:
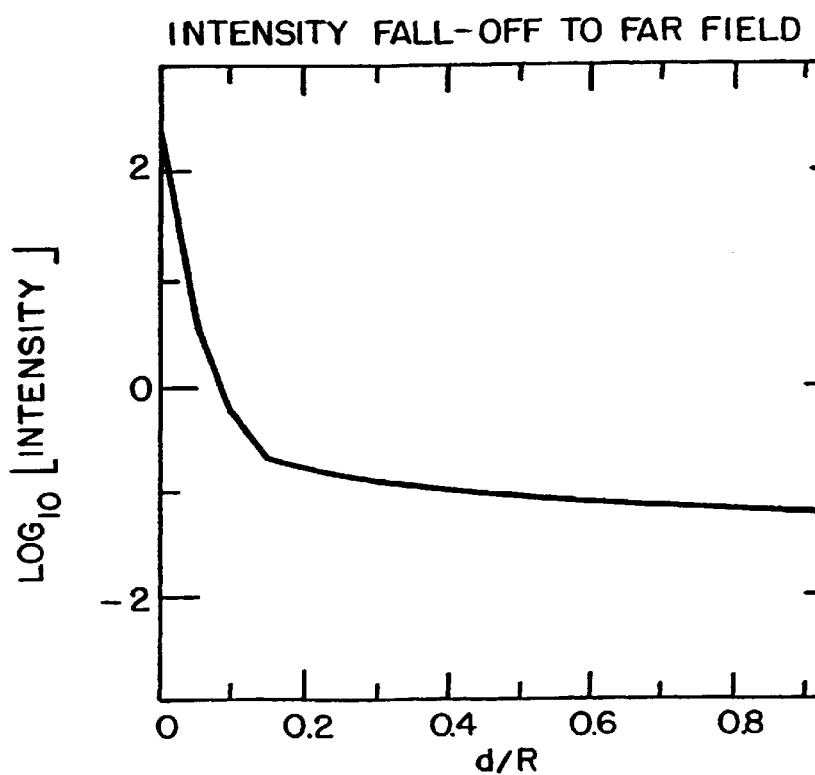
FIG. 6 is a plot of the electric field intensity of an ARC resonance as a function of distance from the surface of an ARC with a 12% distortion, a mean radius of R=7.5 $\mu$m, a refractive index n=2 and a resonant wavelength of 1.5 $\mu$m

Returning to FIG. 4, we now discuss directional coupling into and out of the ARC. Optical energy may be coupled into the ARC 20 by a variety of means, for example from a tangentially incident laser beam, perhaps combined with a prism coupler, or by an optical fiber 32 which is parallel to the tangent at the points of highest curvature and positioned within the nearfield of the outer surface 22. In FIG. 6 we show a plot of the numerically calculated light intensity from a WG resonance as a function of distance from the surface moving perpendicular to the points 40, 42 (FIG. 4). It is found that the near-field fall-off extends for a distance, d, where d is of order 10% of the radius R of the ARC. In order to have good coupling the fiber 32 must be positioned within this distance; if it is, then an optical signal at a resonant wavelength $\lambda$ will be coupled from the input waveguide 32 into the ARC 20 at the point 40, inducing a clock-wise propagating beam 24. This beam will then transmit the signal to the output fiber 44 in the form of beam 38 which exits the ARC at the point 42 diametrically opposite the point of injection 40. The output signal 38 propagates parallel to the input signal, but in the opposite direction; some of the input signal is reinjected into the fiber at 40 as well. This configuration will be efficient only if: 1) The ARC has an appropriate shape and index of refraction. 2) The points 40, 42 are correctly chosen. 3) The coupling fibers are placed within the distance d. We now indicate how this is achieved.

As discussed briefly above, a light ray initially trapped in an ARC resonance can ultimately escape by refraction, whereas this cannot occur for a symmetric cavity. In order to design an ARC with predictable and controllable emission, which is also highly directional, it is then necessary to understand at what points on the boundary of the ARC this refractive escape occurs, and how to confine-this escape to a narrow region resulting in a highly directional beam. The motion of the light rays within an ARC is partially chaotic. That means that for a large fraction of initial conditions nearby ray trajectories diverge exponentially rapidly. Therefore the necessary concepts come from the theory of non-linear dynamics and chaos. We now present a brief summary of the most relevant concepts.

Figure 7:
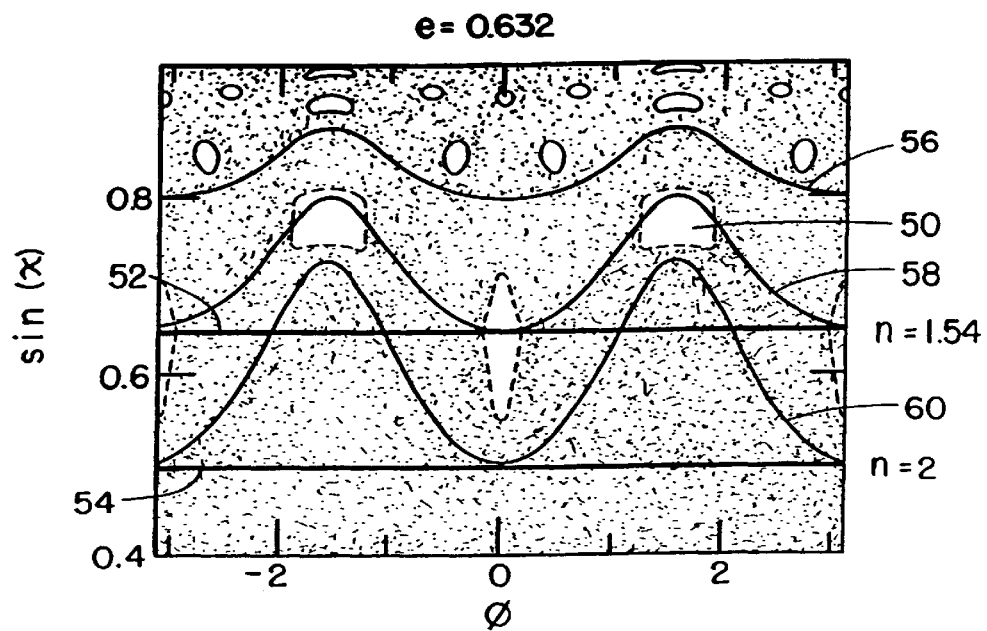
FIG. 7 is a "surface of section" for a cylindrical ARC which represents many possible ray trajectories within the ARC. Each point on the plot represents one collision of a ray trajectory which occurs at that particular value of the sine of the angle of incidence $\sin \chi$, and $\phi$, the azimuthal angle (see definitions of FIG. 4).

In order to understand the high emission directions from ARCs, it is essential to analyze the ray dynamics in phase space, which in this context means analyzing not only where the trajectories of interest collide with the boundary, but also at what angle $\chi$ they collide. The standard technique used in non-linear dynamics to obtain an understanding of such system is the Poincare surface of section (SOS). It is obtained by plotting, for successive reflections of a ray, the angular position ø along the boundary surface 22 where the reflection occurs, and the value of sin $\chi$ at this collision. Recording on the SOS a relatively small number of ray trajectories (~10–20) for about 500 reflections yields a detailed picture of the possible ray trajectories. Such a plot representing ray trajectories in the cylindrical ARC described by Eq. (1) is shown in FIG. 7. It exhibits three types of regions. First one sees regions of "random" disconnected points which are caused by chaotic trajectories. Second there are closed curves 50 which are known as islands or island chains. The centers of these islands represent stable periodic trajectories. A trajectory is periodic if it repeats itself after a finite number of collisions with the boundary and stable if a slight change in direction yields a trajectory which remains near the original one. These islands then represent possible regular (non-chaotic) ray trajectories. Other types of non-chaotic trajectories can exist as well but are not relevant to this discussion. The thick solid lines 52,54 represent the value of sin $\chi=1/n$ at which refractive escape is possible. Any trajectory which hits the boundary below those lines will escape with high probability, hence the points below the line are only for illustrative purposes and do not represent trajectories in a real ARC (but rather a hypothetical ARC with no refractive escape). The SOS shown in FIG. 7 is typical of cylindrical ARCs with two reflection symmetry axes, so it represents a case of practical interest. An ARC with precisely elliptical cross-section is unique as it has no chaotic trajectories and will behave differently from the generic case; hence this is not a preferred embodiment of the invention.

There are two crucial ideas for predicting the direction of light emission from such an ARC. First, a trajectory which starts anywhere in a chaotic region will eventually explore the whole chaotic region; however it will never cross over into the island regions. Second, as such a chaotic ray "explores" the chaotic region it does not actually move randomly within it, but rather for hundreds of collisions follows "adiabatic curves" given by the equation $$\sin \chi(\text{ø}) = \sqrt{1-(1-S^2)\kappa(\text{ø})^{2/3}}, \quad (2)$$

where $\kappa(\text{ø})$ is the curvature of the interface and S is a constant parametrizing the curves; S is roughly equal to the average value of sin $\chi$ on the curve and varies between 1 and 0. Three examples of the adiabatic curves 56,58,60 for different values of S are drawn in FIG. 7, including two examples which are tangent to the bold lines delineating the angle at which refractive escape occurs. (The tendency of chaotic trajectories to follow these curves is not directly visible in the Figure, but is well-established by computer simulations).

Figure 8:
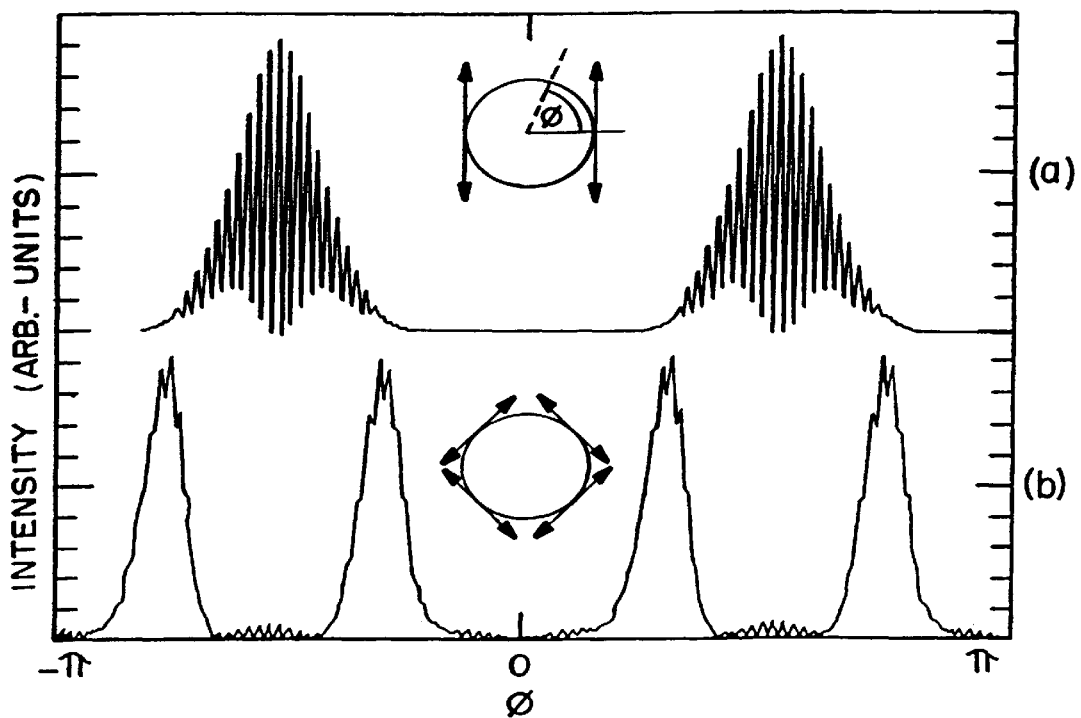
FIGS. 8(a)–8(b) are plots of the intensity of light emitted from a quadrupole-deformed ARC versus angle $\phi$ for n=2 when there are two parallel beams and n=1.54 where there are four non-parallel beams emitted.

We have determined that rays with initial conditions in the chaotic region and with an initial sin $\chi>1/n$ will have the highest probability of escape exactly at the points at which the adiabatic curve is tangent to the escape line, unless an island in the surface of section excludes those points from the chaotic region. The first points of tangency will be given by the minima of the function sin $\chi(\text{ø})$ in Equation (2). It follows from the form of Equation (2) that these are the two points of highest curvature on the boundary. Hence the points of highest emission intensity can be found simply from Equation (2) or equivalently from a knowledge of the curvature of the ARC surface. FIG. 7 shows both the case where there is no blocking island which occurs for refractive index n=2; and the case with a blocking island, for refractive index, n=1.54. In the case n=1.54 (blocking island), light escapes equally on both sides of the island. Thus the case n=2 leads to two parallel beams, as illustrated in FIG. 4; whereas the latter case, n=1.54 leads to four intersecting beams. This difference is also seen in the far-field intensity patterns calculated in FIG. 8. For n=2 there are two peaks corresponding to the two parallel beams and for n=1.54 there are four peaks. Thus for an ARC of this shape a material with n≈2 would be necessary to generate a single beam. In general, by using these concepts and Equation (2) we can design ARCs for which the points of high emission intensity are known and which do not generate multiple, non-parallel beams.

Experimental evidence demonstrating the correctness of these concepts has been recently obtained from a measurement of the lasing emission produced by liquid dye columns. Ethanol containing Rhodamine B dye was forced through circular and rectangular orifices. The dye column produced by the circular orifice (of radius 75 $\mu$m) is cylindrical, whereas that produced by the rectangular orifice (of dimension 1000 $\mu$m×25 $\mu$m) has an oval cross-section with an eccentricity which decays (because of viscous damping) until it is nearly circular at 2 cm from the orifice. The cross-sectional distortion which experiences the smallest damping is quadrupolar, so that we expect the dominant deformation to be roughly given by Eq. (1). Hence the dye column at the appropriate height provides a realization of a cylindrical quadrupolar ARC. The surface tension causes the major axis of the quadrupole to oscillate in orientation with respect to the long axis of the orifice. The index of refraction for ethanol is n≈1.3 and there are no blocking islands at the high curvature points. Thus we expect to see high emission intensity in the direction perpendicular to the long axis of the deformed cross section which will be rotated by 90° with each half-cycle of the quadrupolar oscillation. The dye column was pumped with a 537 nm pulsed dye laser with pulse duration≈5 ns. The pump laser is oriented perpendicular to the long-axis of the rectangular orifice. Two collection lenses set to f/22 were placed at 0° and 90° relative to the pump laser beam. By using mirrors and a beam splitter, lasing images produced by the two lenses were combined side by side on a single CCD detector and were recorded simultaneously with appropriate calibration to preserve spatial correspondence anywhere along the column. As predicted by the theory, we observe (FIG. 9a) a striking oscillatory rotation of the high emission intensity between the 90° and 0° images, commensurate with the oscillation of the deformation of the cross section. No such oscillatory behavior is observed in the lasing emission from the circular control column (FIG. 9(b)). This experiment demonstrates that the basic concepts for achieving useful directional emission from ARCs are sound and can be used in the design of optical devices. We now list four device designs which make use of the ARC invention.

Channel-dropping Filter

The current state-of-the-art fiber-optic communications networks use wavelength-division-multiplexing to maximize data transmission rates. These systems send different signals simultaneously at many different wavelength and require channel-dropping filters to receive selectively each wavelength channel. FIG. 10 illustrates a channel-dropping filter employing the ARC resonator. The input fiber 100 is carrying signals on wavelengths $\lambda_1, \lambda_2, \lambda_3, \ldots$. The ARCs 102, 104 are constructed so as to have resonances at the wavelengths $\lambda_1$ and $\lambda_2$ respectively. As a result $\lambda_1$ is coupled into output fiber 106 and into receiver 1, whereas $\lambda_2$ is coupled into output fiber 108 and into receiver 2. Thus such an ARC array may function as a selective filter for wavelength division multiplexed (WDM) signals. The directional emission property of the ARC will improve the efficiency of filtering compared to symmetric resonators by at least one order of magnitude and the optimization of the Q-value may increase it even further.

Optical Amplifier

Figure 11:
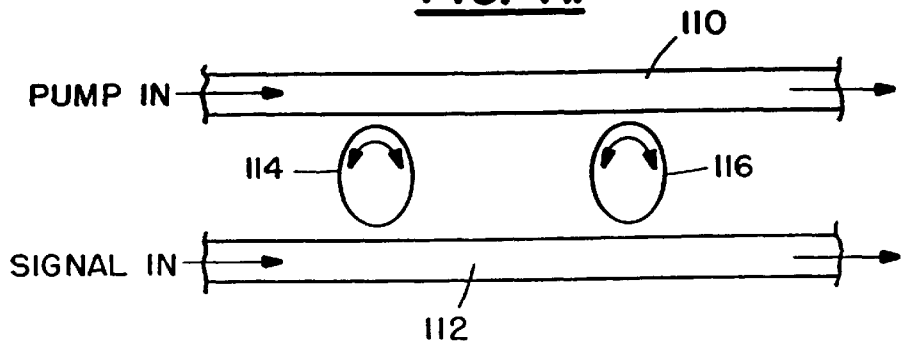
FIG. 11 is a schematic of an optical amplifier which makes use of ARCs incorporating the invention hereof.

Fiber-optic communication networks also require optical amplifiers to regenerate signals on long-haul fibers. Rare-earth (erbium) doped glass is currently used for all-optical amplification at the wavelength 1.5 μm however there is a need for all-optical amplifiers outside the gain region of conventional erbium amplifiers. It has been proposed that microcavity amplifiers would shift the gain spectrum appropriately. FIG. 11 illustrates an optical amplifier employing an array of ARC microcavities. The pump which provides the energy for amplification is applied to the signal fiber 112 via rare-earth doped ARCs 114 and 116 which amplify the outgoing signal.

Wavelength Converter

Figure 12:
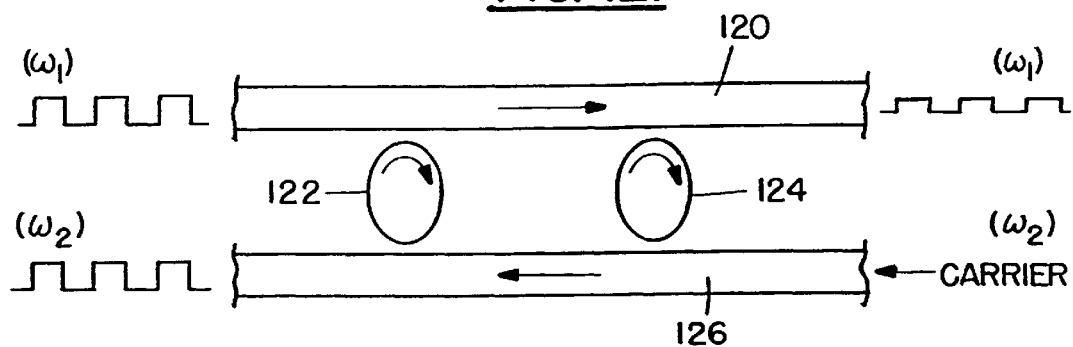
FIG. 12 is a schematic of wavelength converter which makes use of ARCs incorporating the invention hereof.

Fiber-optic communication networks also require converting signals from one wavelength to another, preferably in an all-optical manner. A method for doing this is cavity-enhanced four-wave mixing which can be combined with the ARC invention as illustrated in FIG. 12. The input signal at $\omega_1$ to be converted is fiber 120 and is resonantly transmitted to the ARCs 122 and 124. At the same time a continuous wave (CW) carrier signal at frequency $\omega_2$ is also transmitted from fiber 126 into the ARCs. These ARCs are fabricated of a material with a high non-linear mixing optical coefficient $\chi^{(3)}$ and hence generate a copy of the first signal at the new frequency $\omega_2$ which is then transmitted as output on waveguide 126.

Microlasers

Figure 13:
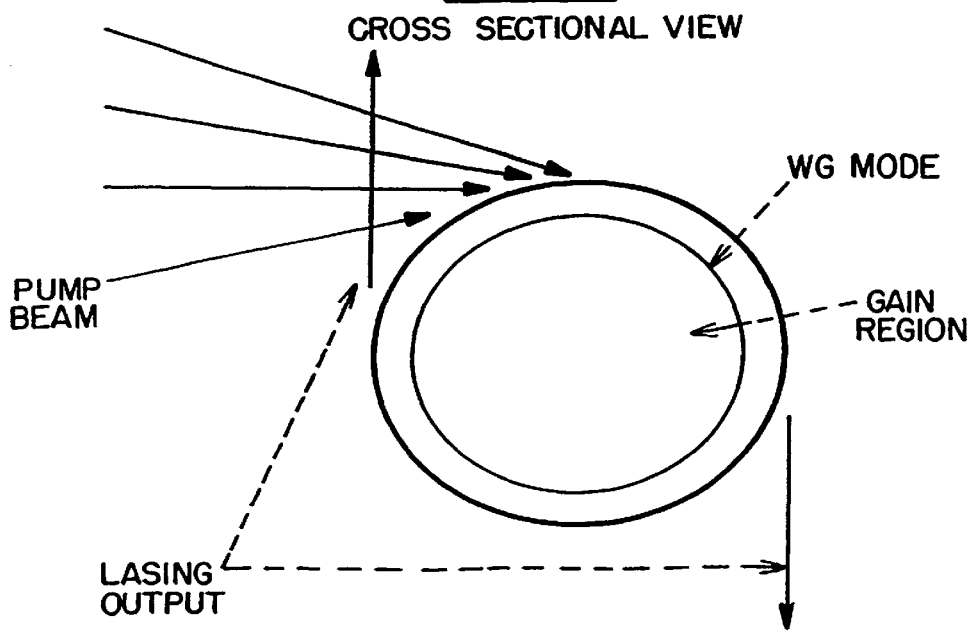
FIG. 13 is a schematic of a laser which makes use of an ARC incorporating the invention hereof.

Finally ARCs can employed as resonators for microlasers (or LEDs). In FIG. 13 we show a schematic of such a device. A pump signal (electrical or optical) is applied to an ARC doped with a gain material in the spatial region where WG resonances exist. The ARC generates a lasing signal at resonant wavelengths which are amplified by the gain profile of the gain material. Such a design would generate directional emission automatically, without the need for gratings or auxiliary waveguides which have been used in micro-disk and micro-ring lasers.

It should be understood that the foregoing description is only illustrative of the invention. Various alternative applications and modifications can be devised by those skilled in the art without departing from the invention. Accordingly, the present invention is intended to embrace all such alternatives, modifications and variances which fall within the scope of the appended claims.

What is claimed is:

1. A resonant optical apparatus, comprising:

a resonant cavity (ARC) of non-circular cross-section and having a dielectric constant n, an outer surface and an oval cross-section of area A defining a plane, having a long dimension arrayed along a major axis of said plane and a shorter dimension arrayed along a minor axis of said plane, said major axis and minor axis intersecting at a center of said ARC, said oval cross-section exhibiting mirror symmetry about both said major axis and said minor axis, said oval cross-section deformed from a circular resonator of cross-section of area A; and input means for inducing an optical signal of wavelength $\lambda$ into said ARC to cause a circulation of induced optical energy of wavelength $\lambda$ in said plane and emission of said optical energy of wavelength $\lambda$ from said ARC in said plane.

2. The resonant optical apparatus as recited in claim 1, wherein said surface point is determined from the following expression for Sin $\chi(\phi)$ $$\mathrm{Sin}X(\phi) = \sqrt{1 - (1 - S^2)\kappa(\phi)^{2/3}} = 1/n$$

for a minima of $\mathrm{Sin}\chi(\phi)$, where: S is a constant which parameterizes the outer surface, $\chi(\phi)$ is the angle of incidence at angle ($\phi$), $\theta(\phi)$ is a local curvature of the outer surface.

3. The resonant optical apparatus as recited in claim 1, wherein n and S are adjusted so that light is emitted at and about said surface point with a single peak intensity.

4. The resonant optical apparatus, as recited in claim 1, wherein said resonant cavity exhibits a deformed cylindrical shape.

5. The resonant optical apparatus, as recited in claim 1, wherein said resonant cavity exhibits a deformed oblate or prolate spheroid shape.

* * * * *